(12) United States Patent
Ito

(10) Patent No.: US 7,704,857 B2
(45) Date of Patent: Apr. 27, 2010

(54) METHOD OF MANUFACTURING SEMICONDUCTOR DEVICE

(75) Inventor: Daisuke Ito, Nagano (JP)

(73) Assignee: Shinko Electric Industries Co., Ltd., Nagano (JP)

(*) Notice: Subject to any disclaimer, the term of this patent is extended or adjusted under 35 U.S.C. 154(b) by 0 days.

(21) Appl. No.: 12/335,861

(22) Filed: Dec. 16, 2008

(65) Prior Publication Data

US 2009/0170288 A1 Jul. 2, 2009

(30) Foreign Application Priority Data

Dec. 18, 2007 (JP) ............................ 2007-326455

(51) Int. Cl.
*H01L 21/00* (2006.01)
(52) U.S. Cl. ................. 438/462; 257/E21.599
(58) Field of Classification Search ................. 438/462
See application file for complete search history.

(56) References Cited

U.S. PATENT DOCUMENTS

| | | | |
|---|---|---|---|
| 2005/0130390 A1* | 6/2005 | Andrews et al. | 438/458 |
| 2006/0096962 A1* | 5/2006 | Park | 219/121.72 |
| 2007/0111477 A1* | 5/2007 | Maruyama et al. | 438/460 |
| 2007/0293019 A1* | 12/2007 | Jeng et al. | 438/460 |
| 2008/0265378 A1* | 10/2008 | Lee et al. | 257/620 |

FOREIGN PATENT DOCUMENTS

JP 2000-243729 9/2000
JP 2004-235626 8/2004

* cited by examiner

*Primary Examiner*—Alexander G Ghyka
(74) *Attorney, Agent, or Firm*—Drinker Biddle & Reath LLP

(57) ABSTRACT

After a semiconductor element is formed and before resin sealing is performed, a surface of a scribe line between the adjacent semiconductor elements of a semiconductor wafer is scraped thinly. A laser is irradiated on a broken layer of the surface of the scribe line thus scraped thinly to recrystallize the broken layer.

6 Claims, 8 Drawing Sheets

METHOD OF MANUFACTURING SEMICONDUCTOR DEVICE

FIELD OF THE INVENTION

The present disclosure relates to a method of manufacturing a semiconductor device. More particularly, the present disclosure relates to a method of manufacturing a semiconductor device by forming a wafer level package (WLP) in which a semiconductor element is formed on a semiconductor wafer made of a silicon and dividing the semiconductor wafer into individual pieces to form a semiconductor device which is referred to as a so-called chip sized package (CSP).

DESCRIPTION OF RELATED ART

A semiconductor device is formed by forming a circuit and rewiring the circuit on a semiconductor wafer made of a silicon, sealing the circuits with an epoxy based resin, and cutting the semiconductor wafer through a dicing blade to divide the wafer into individual pieces.

The semiconductor device is referred to as a chip sized package (CSP) or a just chip size package. The semiconductor wafer is provided with a dicing lane to be a cutting margin of the individual semiconductor element (chip) at cutting the semiconductor wafer. The dicing lane is referred to as a scribe line. An element which is usually referred to as an element of test element group (TEG element) is embedded in the scribe line to check a process condition in a preceding process of the wafer.

Through a dicing process of dividing a wafer level package (WLP) into individual pieces, a section of the semiconductor element group is exposed to a side surface of the semiconductor device. Consequently, peeling or a crack may be caused on a bonding surface of a chip function portion of the semiconductor element and the sealing resin because of a difference in thermal expansion between the chip function portion and the sealing resin, or because of an incompatibility of an adhesion between different types of materials between the chip function portion and the sealing resin. Then, a bad influence is exerted, for example, the element circuit portion is damaged due to an infiltration of water from the cracked portion. The bad influence causes a decrease of a mounting reliability in which the semiconductor device divided into the individual pieces is mounted on a substrate.

Therefore, a serial method of manufacturing semiconductor device is proposed to grind a scribe lane to enhance a reliability in order to remove the TEG elements and to provide the sealing resin around the side surface of the semiconductor device.

For example, Japanese laid-open publication JP-A-2000-243729 (Patent Document 1) shows enhancing a reliability of a sealing resin in a manufacture of a chip sized package (CSP) on a wafer level. More specifically, a wiring and a conductive strut for electrically connecting each electrode pad to an external connecting terminal are formed on a wafer on which semiconductor elements are formed. A trench (preferably, taking a V shape) is formed on a surface of the wafer along a boundary line of each semiconductor element. Next, the wafer is covered with a resin so as to expose an end face of the conductive strut. The external connecting terminal is disposed on the end face of the conductive strut. At a final process, the wafer is diced along the boundary line of the semiconductor element so that a packaged semiconductor device is obtained.

Japanese laid-open publication JP-A-2004-235626 (Patent Document 2) shows a semiconductor device capable of suppressing a decrease of a characteristic, a failure, and a reduction in a transverse strength of a semiconductor element. A damage layer serving as a starting point for a division into individual semiconductor devices is formed on a back side of a surface, on which the semiconductor element is formed, of a semiconductor wafer. By setting the damage layer as the starting point, the semiconductor wafer is divided into the individual semiconductor devices. Then, a back face of the semiconductor wafer is removed into such a depth that at least the damage layer is not present. Consequently, the damage layer is removed through back face grinding after the division of the wafer. Therefore, it is possible to minimize a damage without leaving a grinding track on the side surface of the semiconductor device.

In the related-art method of manufacturing a chip sized package (CSP) on a wafer level, more specifically, all techniques serve to grind (half cut) a dicing lane through a dicer, to form a trench, to perform resin sealing and to perform dicing for a final division into individual pieces.

In the related-art method of manufacturing a semiconductor device on a wafer level, a main purpose is to provide a resin around the side surface of the chip sized package. First of all, therefore, it is necessary to accurately align the trench with a final cutting position. Secondly, it is necessary to perform deep grinding in order to introduce the resin into the side surface. As a result, there is a problem in that a wafer is apt to be broken considerably. Moreover, the trench is processed through mechanical grinding by a dicer. Therefore, a broken layer of a silicon is left on a bottom of the processed trench and the semiconductor wafer is apt to be broken. The broken layer is exposed to the side surface of the semiconductor device divided into the individual pieces. Therefore, the broken layer serves as a starting point of a chip crack in the mounting of the semiconductor device on a substrate so that the reliability of the semiconductor device is decreased.

As described above, according to the related-art method of manufacturing a semiconductor device disclosed in Patent Document 1 or 2, it is hard to accurately align the trench with the final cutting position. Therefore, it is necessary to make a complicated and frequent alignment. In order to introduce the resin into the side surface of the semiconductor device, moreover, it is necessary to deeply grind the trench for the division into individual pieces. As a result, the semiconductor wafer is apt to be broken considerably. When a package size is reduced, furthermore, a risk of a crack is increased and the process itself disturbs a reduction in a thickness.

SUMMARY OF INVENTION

The invention provides a method of manufacturing a semiconductor device which does not require a complicated and frequent alignment when a semiconductor wafer is divided into individual semiconductor devices and has a small risk of a breakage or peeling on a side surface of the semiconductor device thus cut in the case in which a semiconductor device which is referred to as a so-called chip sized package (CSP) is formed.

According to a first aspect of the invention, a method of manufacturing a semiconductor device is provided with the processes of forming a plurality of semiconductor elements on a semiconductor wafer, sealing a surface, on which the semiconductor elements are formed, of the semiconductor wafer, with a resin, dividing the semiconductor wafer into individual pieces every semiconductor element to form a semiconductor device, thinly scraping a surface of a region of a scribe line between the adjacent semiconductor elements of the semiconductor wafer and irradiating a laser on a broken layer of the surface of the scribe line to recrystallize the broken layer, wherein the thinly scraping step and the laser irradiating step are performed after the semiconductor element forming step and before the resin sealing step.

According to a second aspect of the invention, a TEG element embedded in the scribe line may be removed in the thinly scraping step.

According to a third aspect of the invention, a method of manufacturing a semiconductor device is provided with the processes of forming a plurality of semiconductor elements on a semiconductor wafer, forming two parallel fine trenches at a predetermined interval on a surface of a region of a scribe line between the adjacent semiconductor elements of the semiconductor wafer through a grinding processing, irradiating a laser on a broken layer of the surface of the scribe line generated by the grinding processing for the fine trench to recrystallize the broken layer, sealing a surface, on which the semiconductor elements are formed, of the semiconductor wafer, with a resin and cutting the semiconductor wafer between the two fine trenches to divide the semiconductor wafer into individual pieces to form a semiconductor device.

According to a fourth aspect of the invention, the two fine trenches may be formed across a TEG element embedded in the scribe line in such a manner that the TEG element remains between the two fine trenches in the fine trench forming step.

According to a fifth aspect of the invention, a YAG laser may be irradiated on the broken layer of the surface of the scribe line.

Other aspects and advantages of the invention will be apparent from the following description, the drawings and the claims.

DETAILED DESCRIPTION OF THE PREFERRED EMBODIMENT

Embodiments will be described below in detail with reference to the accompanying drawings.

Figure 1:
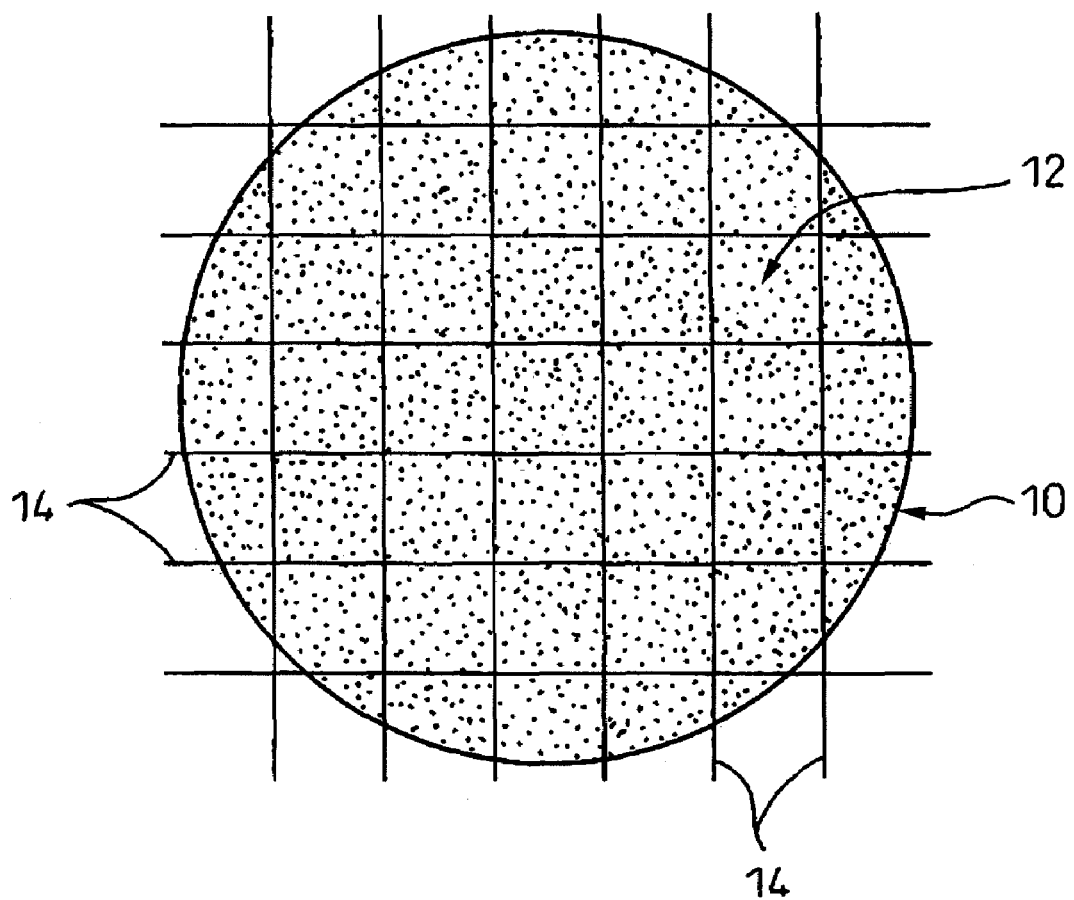
FIG. 1 is a plan view showing a silicon wafer for forming a semiconductor device.

FIG. 1 is a plan view showing a silicon wafer for forming a semiconductor device. In a wafer level package (WLP), a large number of integrated circuit 12 (semiconductor element) are formed on a semiconductor wafer 10. A surface having the integrated circuits 12 formed on the semiconductor wafer 10 is sealed with a resin. The semiconductor wafer 10 is divided into individual pieces every integrated circuit 12 along a scribe line 14.

In a first embodiment, after the large number of integrated circuits 12 are formed on the semiconductor wafer 10 and before resin sealing is performed, a surface of a region of the scribe line 14 is scraped thinly between circuit areas of the adjacent integrated circuits 12 in the semiconductor wafer 10. A laser is irradiated on a broken layer of the surface of the scribe line 14 scraped thinly to recrystallize the broken layer.

Figure 2:
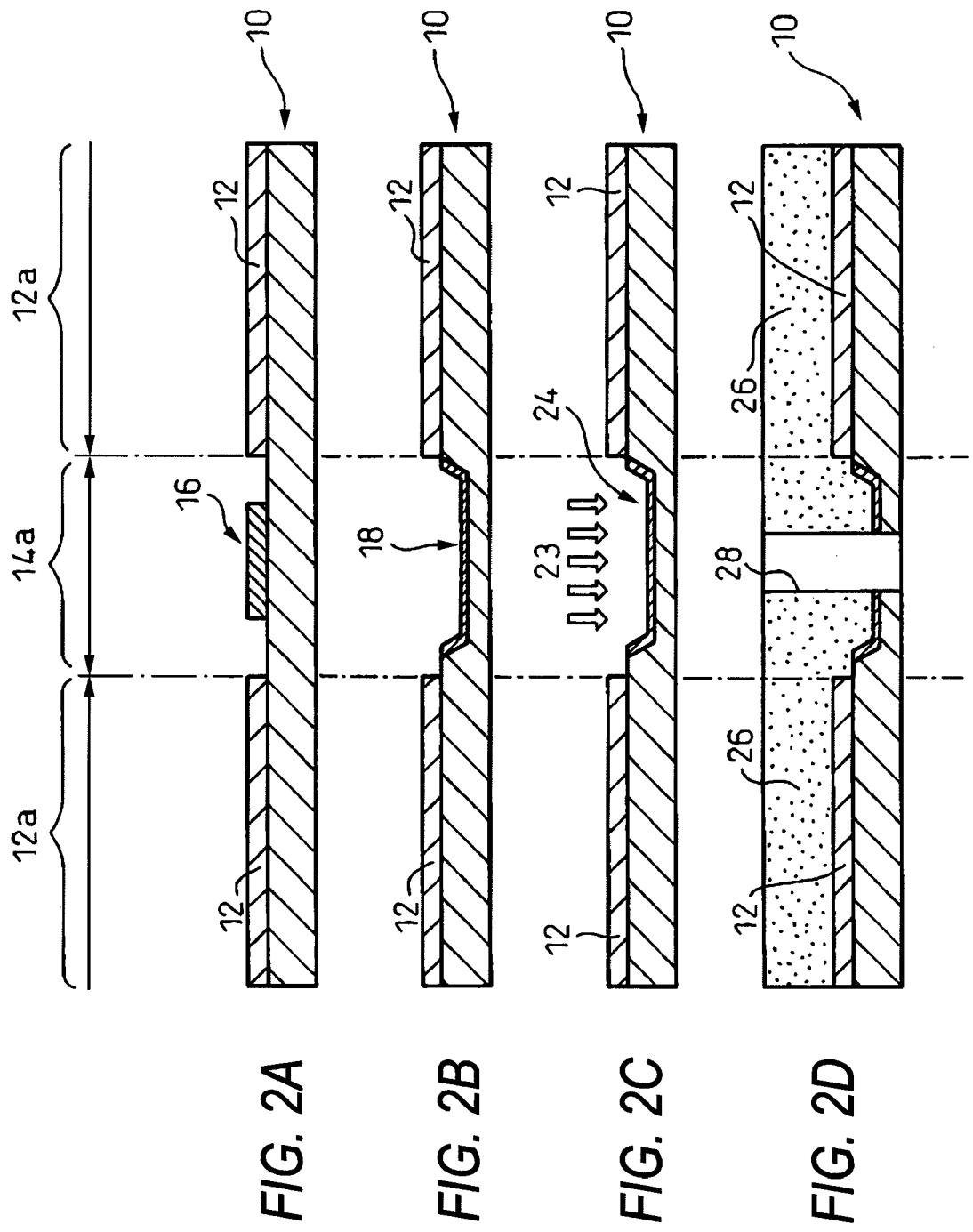
FIG. 2A to 2D are views showing processes for manufacturing a semiconductor device according to a first embodiment.

FIGS. 2A to 2D show processes for manufacturing a semiconductor device according to the first embodiment. FIG. 2A shows a state brought after the individual integrated circuit 12 is formed on the semiconductor wafer 10. The integrated circuit 12 is formed on a circuit area 12a of the semiconductor wafer 10. In this state, a TEG element 16 remains in a region 14a of the scribe line 14. The TEG element 16 is used for a test to check the integrated circuit 12 in the preceding process to the process of rewiring the integrated circuit 12 and the like.

In FIG. 2B, a surface of the region 14a of the scribe line 14 between the circuit areas 12a of the adjacent integrated circuits 12 in the semiconductor wafer 10 is scraped thinly through grinding to form a trench 18. That is, a wide processing is performed. A crystal of a silicon material of the semiconductor wafer 10 is scraped from a bottom surface and a side surface in the trench 18 so that a broken layer is formed.

Figure 3:
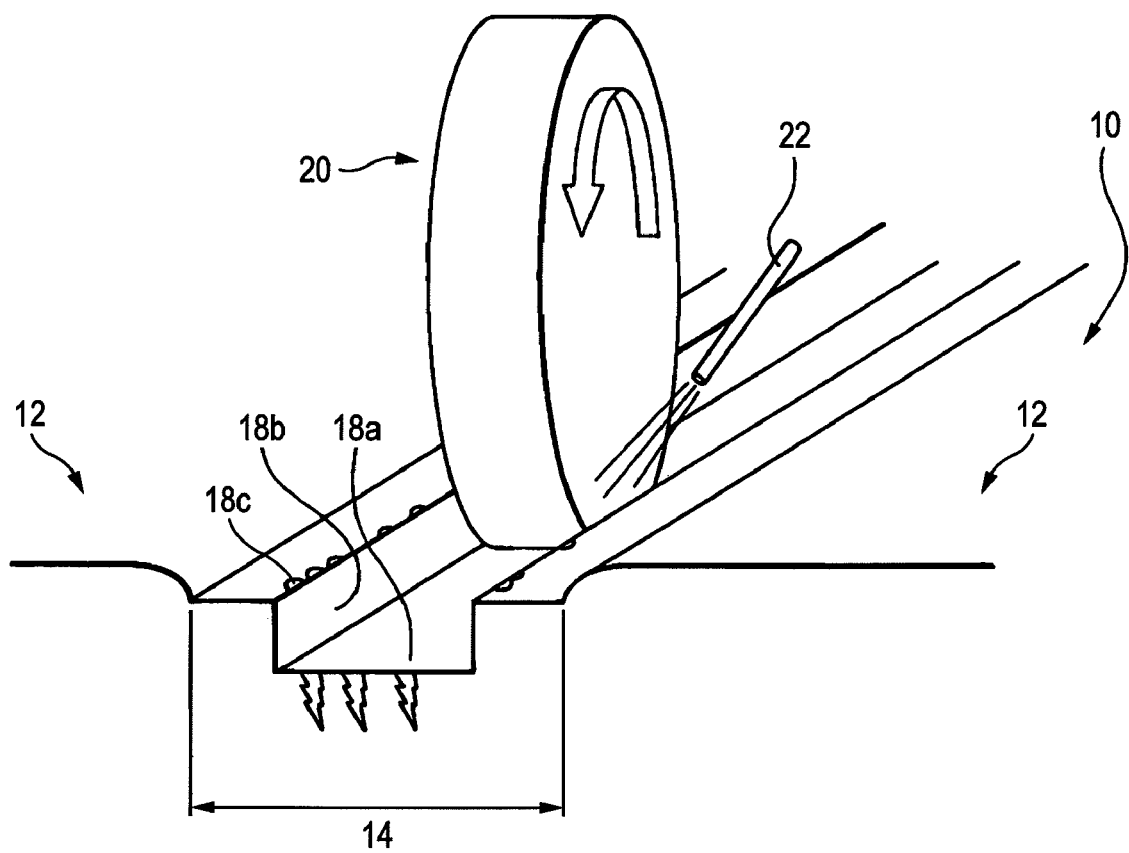
FIG. 3 is a perspective view showing a state in which a surface of a region of a scribe line is thinly scraped (a wide processing is performed) by using a scribe dicer according to the first embodiment.

FIG. 3 is a perspective view showing a state in which the surface of the region of the scribe line 14 is scraped thinly by using a scribe dicer. A rotating diamond dicing blade 20 is usually used as the scribe dicer. The dicing blade 20 has a kerf width (a trench width) of 80 to 100 μm, for example. The dicing blade 20 is rotated in a direction of an arrow and is moved in the region of the scribe line 14 so that the broken layer 18 is formed and the TEG element 16 is scraped and removed. During the grinding processing by the dicing blade 20, a grinding fluid is supplied to a grinding portion of the blade through a grinding fluid supply nozzle 22. The wafer may be designed to have different scribe line widths in X and Y directions. In such a case, a blade corresponding to a smaller scribe line width or a blade having a different kerf width is used.

At a process of thinly scraping the surface of the region of the scribe line 14 by the dicing blade 20, a crystal of a silicon material of the semiconductor wafer 10 is broken so that the broken layer is formed. Furthermore, chippings 18c is generated over a bottom surface 18a and a side surface 18b in the trench 18 to be the broken layer. However, conditions such as an abrasive grain, a rotating speed and a grinding fluid of the dicing blade 20 (the scribe dicer) are selected in such a manner that the TEG element 16 can be removed and the broken layer and the chipping 18c are brought into an optimum state.

As shown in FIG. 2C, a laser 23 is irradiated on the surface of the region of the scribe line 14 which includes the broken layer. A YAG laser is suitably used, which is not particularly restricted. The laser 23 is irradiated so that a portion including the chipping as the broken layer formed by breaking the crystal of the silicon material is recrystallized (24).

As shown in FIG. 2D, a whole surface of the semiconductor wafer 10 which includes the portion obtained by recrystallizing the surface of the region of the scribe line 14 is sealed with an epoxy based resin 26, for example. By using a scribe dicer having a smaller width than the dicing blade 20 for forming a broken layer (for example, a kerf width of 20 to 40 μm), the scribe line 14 is cut (28) to divide the semiconductor wafer 10 into individual semiconductor devices.

Figure 8:
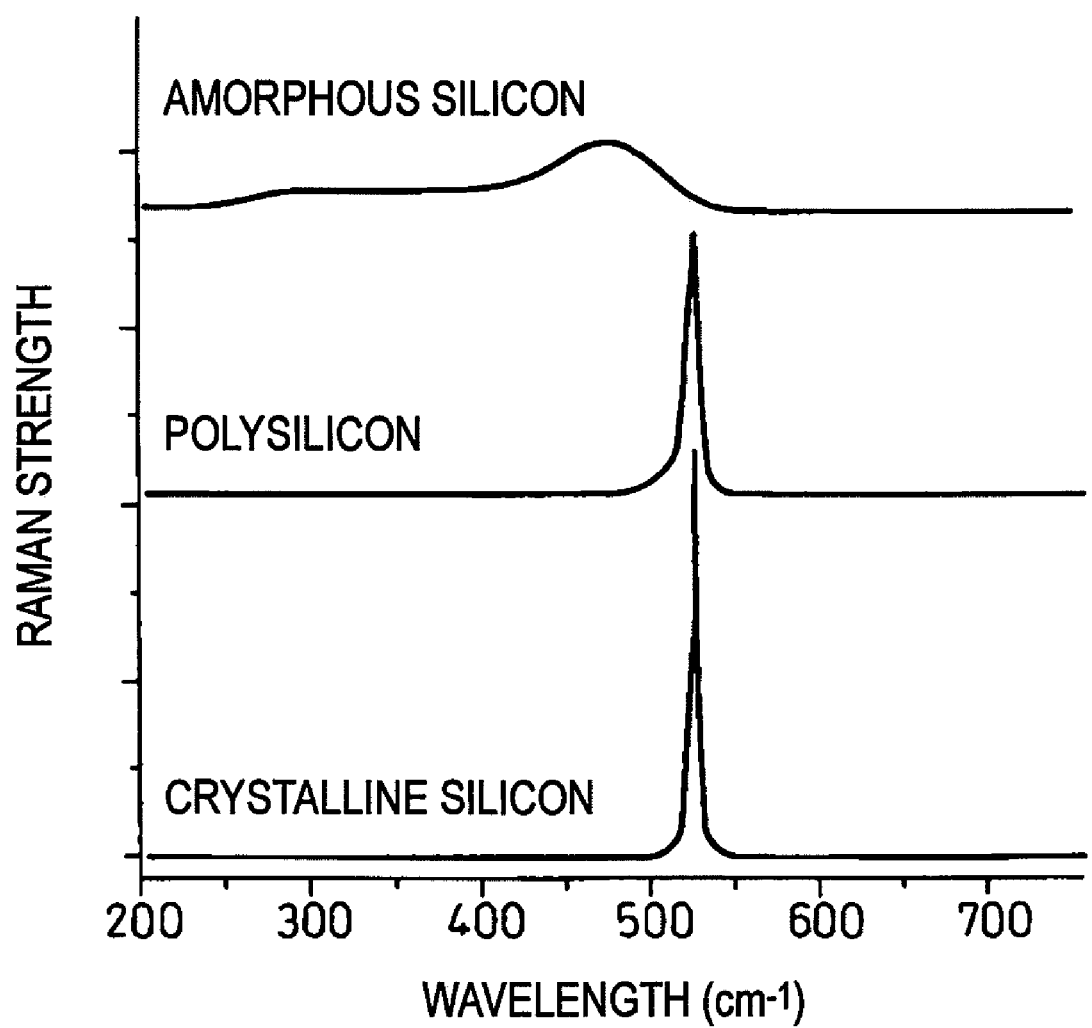
FIG. 8 is a chart showing a Raman spectrum distribution for various silicons.

For reference, FIG. 8 shows a comparison of a relationship between a type of a silicon (that is, a crystalline silicon, a polysilicon and an amorphous silicon) and a Raman strength. A spectrum shown in FIG. 8 indicates a difference in a Raman spectrum depending on a difference in a crystallinity of a silicon. In an elemental analysis, all types of silicon (that is, a crystalline silicon, a polysilicon and an amorphous silicon) are measured as Si single elements and neither of them is distinguished from each other. However, they have different crystal orientations in a micro-crystal and a thin film crystal and for such a measurement of the crystal orientation, the Raman measurement is often used. It is apparent that the amorphous silicon has a high Raman strength and has small specific properties at a specific wavelength. The crystalline silicon has a low Raman strength and a rapidly high Raman strength at a specific wavelength.

Figure 4A:
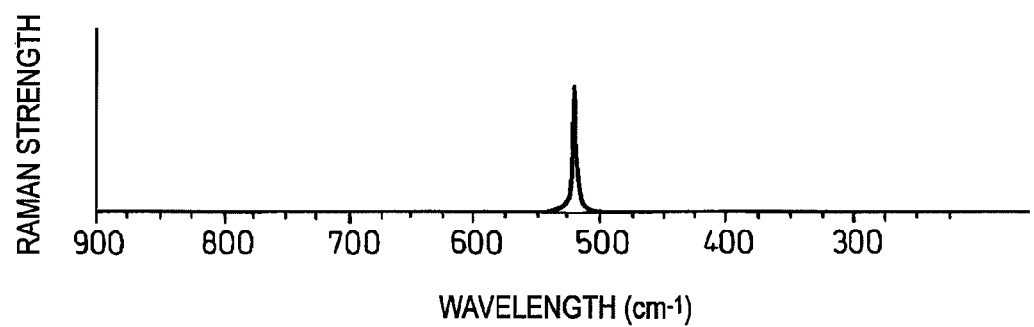
FIGS. 4A and 4B are charts showing a result of a Raman spectrum test for comparing the case in which a laser is irradiated on a broken layer with the case in which the laser irradiation is not performed.
Figure 4B:
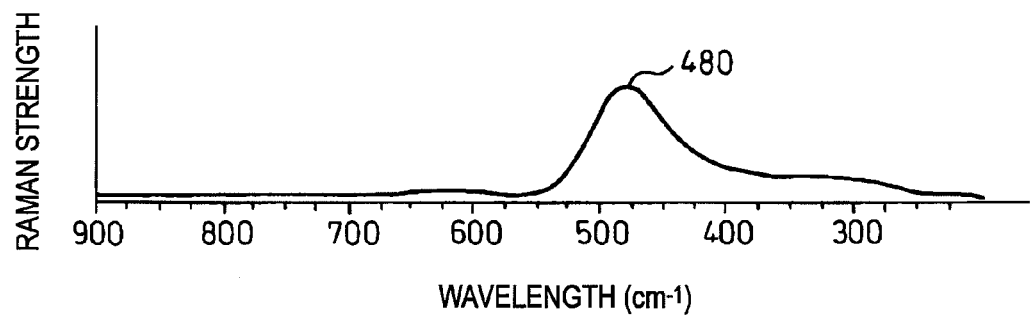

FIG. 4A is a chart showing a result of a Raman spectrum in state of which the laser is irradiated on the broken layer to recrystallize the silicon material on the broken layer as shown in FIG. 2C. FIG. 4B is a chart showing a result of a Raman spectrum in state of which the laser is not irradiated on the broken layer. As shown in FIG. 4A, a recrystalline silicon has a rapidly high Raman strength at a specific wavelength similar to the crystalline silicon. On the other hand, as shown in FIG. 4B, a silicon having the broken layer has small specific properties at a specific wavelength similar to the amorphous silicon.

In a wafer on which a wafer level package is to be assembled, the TEG element 16 on the scribe line 14 is removed by a wide (for example, a kerf width of 85 µm) dicing blade 20 (the scribe dicer). Then, a laser having a YAG second harmonic of 532 nm and 10 mmW/mm$^2$ is irradiated on the trench to recrystallize the broken layer. A width of the scribe line is varied depending on a product. A blade having a smaller kerf width than the width of the scribe line by approximately 20 µm may be used for the dicing blade 20.

The resin sealing and then the division into individual semiconductor devices are performed.

Consequently, peeling is not generated on end faces of the sealing resin 26 and the silicon (Si) in a PCT (Pressure Cooker Test) temperature cycle test. The peeling of the end faces and a progress of a crack from the end faces are not generated also in a secondary test.

In the case in which the scribe line region is not ground, an entire face of silicon wafer has a multilayer structure derived from a diffusing process. The multilayer structure remains as a structural defect between a bulk silicon and the sealing resin after the wafer is divided into individual pieces. Although a difference is made depending on a type of the resin, generation of the peeling by a PCT temperature cycle cannot be avoided.

In the first embodiment, however, the surface of the region of the scribe line 14 is thinly scraped to remove a diffusion layer formed by the diffusing process. The laser 23 is irradiated on the broken layer of the surface of the scribe line 14 thus scraped thinly to recrystallize (24) the broken layer. Consequently, it is supposed that the peeling from the end faces of the sealing resin and the silicon (Si) is not generated through the PCT temperature cycle test. That is, as shown in FIG. 4A, a Raman strength concentrates in a specific wavelength range in the recrystalline silicon. Therefore, it is supposed that the crystallization progresses.

On the other hand, a broken layer caused by a mechanical stress through grinding around a trench remains in sealing to be performed after the trench processing by a dicer according to the related art, and similarly, a crack on an end face progresses in secondary mounting. That is, as shown in FIG. 4B, the Raman strength does not concentrate with respect to a wavelength and the crystallization does not progress in the silicon having the broken layer. Consequently, it is supposed that the crack progresses.

As described above, according to the first embodiment, the fragile broken layer is recrystallized (24). Therefore, it is supposed that a crack on the end face of the silicon (Si) is effectively decreased and a reliability is thus enhanced also in individual division dicing.

Figure 5A:
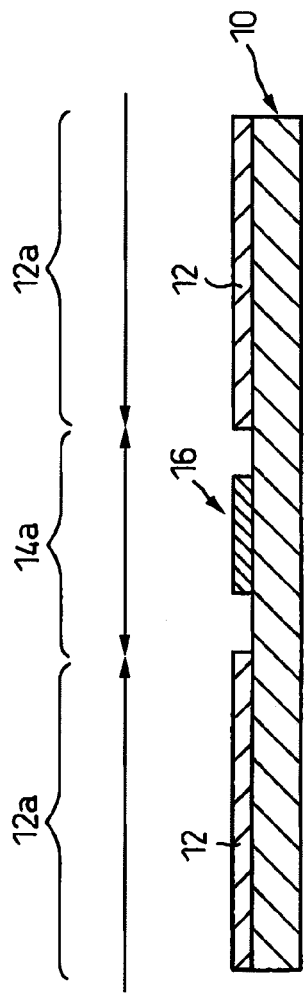
FIG. 5A to 5D are views showing processes for manufacturing a semiconductor device according to a second embodiment.

FIGS. 5A to 5D show processes for manufacturing a semiconductor device according to a second embodiment. FIG. 5A shows a state brought after an individual integrated circuit 12 is formed on a circuit area 12a of a semiconductor wafer 10. A TEG element 16 for a test to check the circuit as a preceding process to a process of rewiring the integrated circuit 12 remains in a region 14a of a scribe line 14.

Figure 5B:
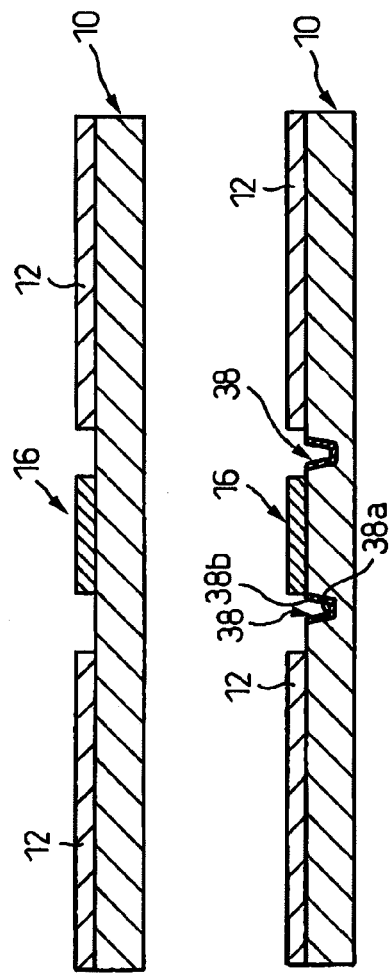

In the first embodiment, the surface of the region 14a of the scribe line 14 between the circuit areas 12a of the adjacent integrated circuits 12 in the semiconductor wafer 10 is scraped thinly through grinding. That is, a wide processing is performed. In the second embodiment, however, two fine trenches 38 are formed on both sides across the TEG element 16 by a dicing blade in a state in which the TEG element 16 is present on a surface of the region of the scribe line 14 as shown in FIG. 5B. In portions in which the fine trenches 38 are formed, particularly, in regions of bottom surfaces and side surfaces of the fine trenches 38, a crystal of a silicon material of the semiconductor wafer 10 is scraped into a broken layer.

Figure 6:
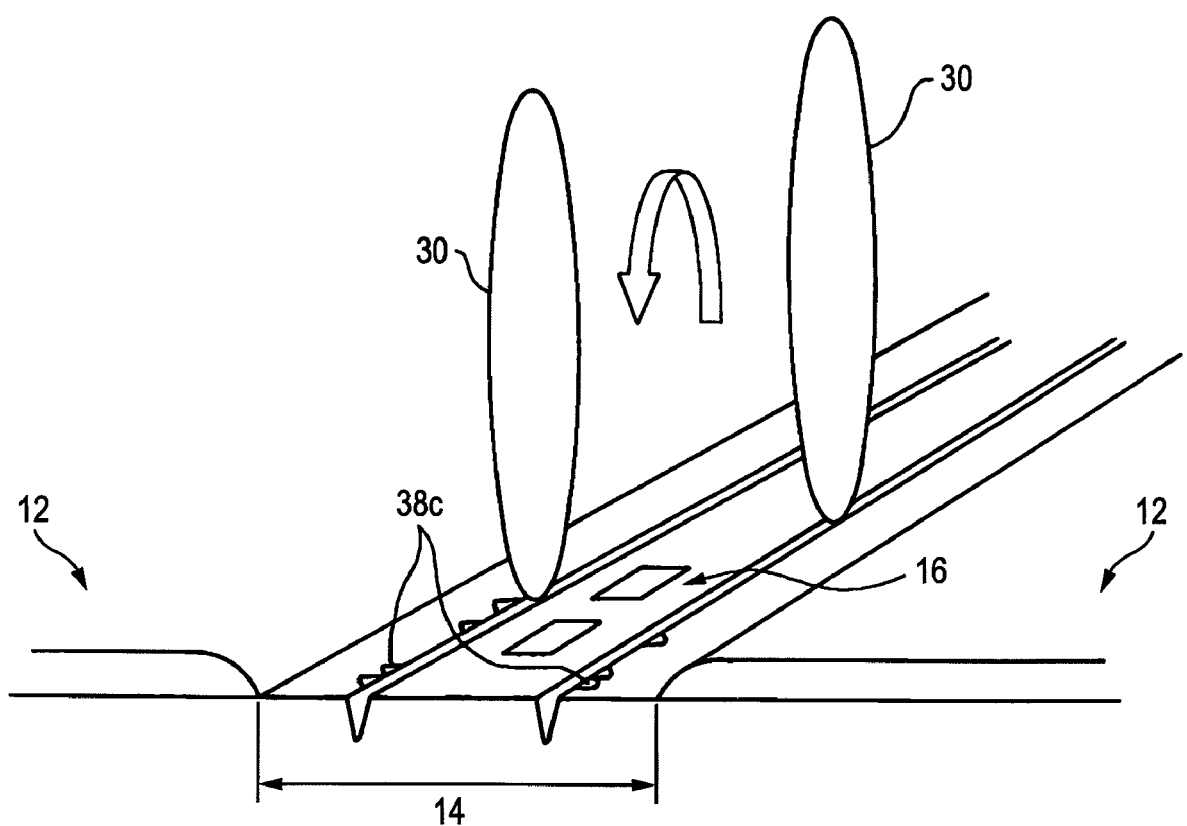
FIG. 6 is a perspective view showing a state in which two trenches are formed on a surface of a region of a scribe line by using a dicing blade according to the second embodiment.

FIG. 6 is a perspective view showing a state in which the two fine trenches 38 are formed on the surface of the region of the scribe line 14 by using a dicing blade 30. A rotating diamond dicing blade is usually used as the dicing blade 30. In the embodiment, for example, two dicing blades 30 having a kerf width of approximately 20 to 30 µm are disposed in parallel at a predetermined interval (for example, an outside of approximately 10 to 20 µm from a circuit forming region of a chip). The two dicing blades 30 are rotated in a direction of an arrow at the same time and are moved in the region of the scribe line 14 to form a trench having a depth of approximately 10 to 40 µm. Consequently, a broken layer is formed along the two fine trenches 38 across the TEG element 16. A grinding fluid is supplied to a grinding portion of each of the dicing blades 30 by means of a grinding fluid supply nozzle during a grinding processing through the two dicing blades 30. Moreover, the wafer may be designed to have different scribe line widths in X and Y directions. In such case, two trenches are processed particularly suitably. The grinding processing is performed at an interval of the trench corresponding to the width of each of the scribe lines in both of the X and Y directions by the same thin dicing blade.

At a process of performing grinding by the two dicing blades 30 to form the two parallel fine trenches 38 on the surface of the region of the scribe line 14, the crystal of the silicon material of the semiconductor wafer 10 is broken into a broken layer. Chipping 38c (FIG. 6) is generated on a bottom surface 38a and a side surface 38b (FIG. 5B) of the fine trench 38 to be the broken layer. Conditions such as an abrasive grain, a rotating speed and a cutting fluid of the dicing blade 30 are selected in such a manner that the broken layer and the chipping 38c are brought into an optimum state.

Figure 5C:
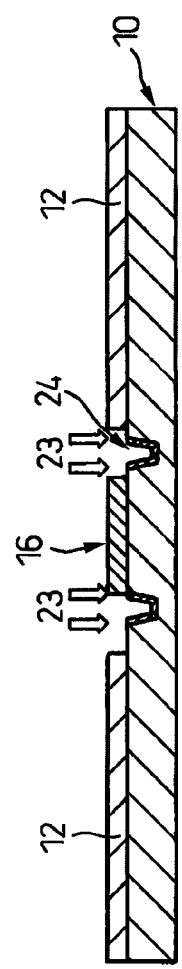

As shown in FIG. 5C, a laser 23 is irradiated along regions of the two fine trenches 38. A YAG laser is suitably used, which is not particularly restricted. Thus, the laser 23 is irradiated so that the fine trench portion including the chipping 38c to be the two broken layers formed by breaking the crystal of the silicon material is recrystallized (24).

Figure 5D:
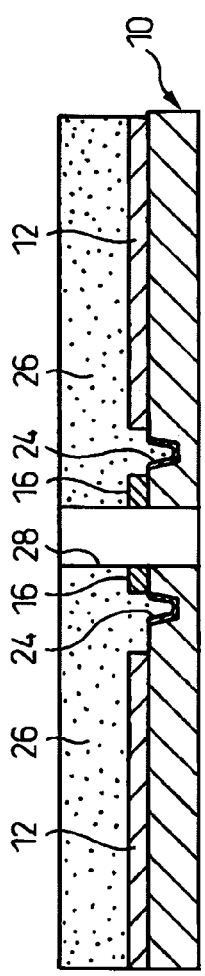

As shown in FIG. 5D, then, a whole surface of the semiconductor wafer 10 which includes the surface of the region of the scribe line 14 having the remaining TEG element 16 and the recrystallized trench portion 24 is sealed with an epoxy based resin 26, for example. By using a dicing blade (for example, a blade width of 20 to 40 μm), the scribe line 14 is cut (28) to perform a division into individual semiconductor devices.

Figure 7A:
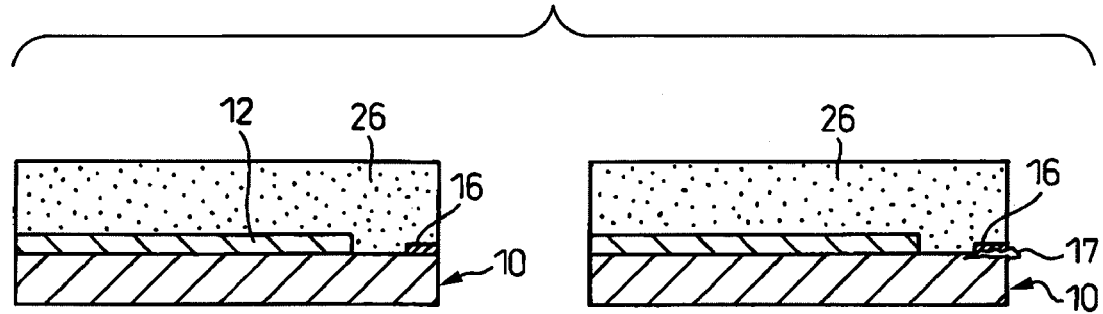
FIG. 7A to 7C are views for explaining advantages obtained by the first and second embodiments.
Figure 7B:
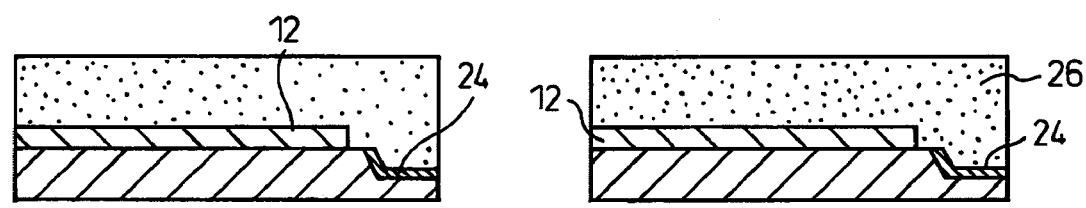
Figure 7C:
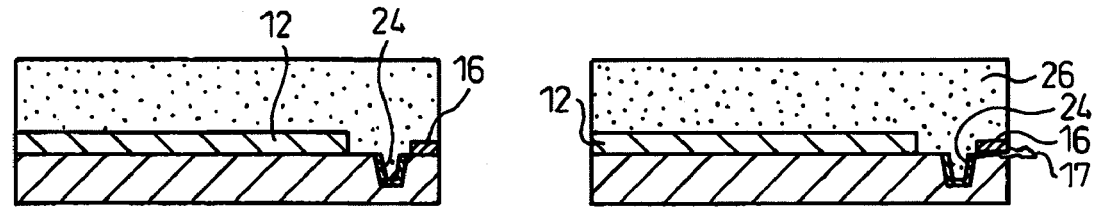

FIGS. 7A to 7C are views for explaining a comparison of advantages obtained by the first and second embodiments. FIG. 7A is a view in the case in which the trench processing and the laser irradiation processing according to the invention are not performed. FIG. 7B is a view in the case of a wide processing for thinly scraping the surface of the region of the scribe line as in the first embodiment. FIG. 7C is a view in the case of a fine trench processing for forming two fine trenches as in the second embodiment. In each drawing, a left side indicates a state brought after a division into individual semiconductor devices through dicing is performed after the resin sealing and a right side indicates a state of progressing a crack.

In the case of FIG. 7A which shows a related-art example, the trench processing and the laser irradiation processing are not performed, the TEG element 16 remains on the surface of the region of the scribe line 14 between the adjacent integrated circuits 12 formed on the semiconductor wafer 10. As shown in a right side of FIG. 7A, a crack 17 advances into an inner part from the side surface of the TEG element 16. As a result, the semiconductor wafer or the semiconductor device divided into individual pieces is apt to be broken. Alternatively, the crack is apt to be progressed in the mounting of the semiconductor element on a substrate. Thus, a reliability of the semiconductor device is decreased.

In the case of the first embodiment (the wide processing) as shown in FIG. 7B, the TEG element 16 is not present as described above, and furthermore, the scribe line is recrystallized (24). Therefore, a defect such as a crack on the side surface of the semiconductor device is removed.

In the case of the second embodiment (the processing for forming two fine trenches) as shown in FIG. 7C, the TEG element 16 remains on the surface of the region of the scribe line 14. Therefore, the crack 17 is apt to be generated on the side surface of the TEG element 16 and easily advances into the inner part. However, the progress of the crack 17 is blocked in the fine trench portion in which the surface is recrystallized (24) through the laser irradiation. The crack 17 does not advance into the inner part any more. Accordingly, the integrated circuit 12 is not influenced by the crack.

According to the first and second embodiments, the broken layer to be the starting point of the peeling or the crack of the sealing resin is removed. Therefore, the peeling and the crack are not caused easily so that a secondary mounting reliability of the device according to the invention can be enhanced.

Furthermore, the surface of the region of the scribe line is scraped thinly and the broken layer is recrystallized. Therefore, it is not necessary to make a complicated and frequent alignment between the trench and a final cutting line as in the related art.

While the embodiments according to the invention has been described above with reference to the accompanying drawings, the invention is not restricted to the embodiments but various configurations, changes and modifications can be performed without departing from the spirit or scope of the invention.

As described above, in a wafer level package according to the invention, after a semiconductor element is formed and before resin sealing is performed, a surface of a region of a scribe line is scraped thinly, and a laser is irradiated on a broken layer of the scribe line surface thus scraped thinly to recrystallize the broken layer. Therefore, it is possible to obtain a semiconductor device in which a fresh silicon surface is exposed in a stage for performing the resin sealing so that an adhesion of a semiconductor silicon in an outer peripheral portion of the semiconductor element and a sealing resin can be enhanced and peeling and a crack can be prevented from being caused. Accordingly, the invention can be applied to all types of semiconductor devices referred to as so-called wafer level packages in which a circuit formation, rewiring and resin sealing are performed over a semiconductor wafer.

What is claimed is:

1. A method of manufacturing a semiconductor device, the method comprising steps of:
    forming a plurality of semiconductor elements on a semiconductor wafer;
    sealing a surface, on which the semiconductor elements are formed, of the semiconductor wafer, with a resin;
    dividing the semiconductor wafer into individual pieces every semiconductor element to form a semiconductor device;
    thinly scraping a surface of a region of a scribe line between the adjacent semiconductor elements of the semiconductor wafer; and
    irradiating a laser on a broken layer of the surface of the scribe line to recrystallize the broken layer,
    wherein the thinly scraping step and the laser irradiating step are performed after the semiconductor element forming step and before the resin sealing step.

2. The method of manufacturing a semiconductor device according to claim 1, wherein a TEG element embedded in the scribe line is removed in the thinly scraping step.

3. A method of manufacturing a semiconductor device, the method comprising steps of:
    forming a plurality of semiconductor elements on a semiconductor wafer;
    forming two parallel fine trenches at a predetermined interval on a surface of a region of a scribe line between the adjacent semiconductor elements of the semiconductor wafer through a grinding processing;
    irradiating a laser on a broken layer of the surface of the scribe line generated by the grinding processing for the fine trench to recrystallize the broken layer;
    sealing a surface, on which the semiconductor elements are formed, of the semiconductor wafer, with a resin; and
    cutting the semiconductor wafer between the two fine trenches to divide the semiconductor wafer into individual pieces to form a semiconductor device.

4. The method of manufacturing a semiconductor device according to claim 3, wherein the two fine trenches are formed across a TEG element embedded in the scribe line in such a manner that the TEG element remains between the two fine trenches in the fine trench forming step.

5. The method of manufacturing a semiconductor device according to claim 1, wherein a YAG laser is irradiated on the broken layer of the surface of the scribe line.

6. The method of manufacturing a semiconductor device according to claim 3, wherein a YAG laser is irradiated on the broken layer of the surface of the scribe line.

* * * * *